(12) United States Patent
Hosokawa

(10) Patent No.: US 7,115,989 B2
(45) Date of Patent: Oct. 3, 2006

(54) ADHESIVE SHEET FOR PRODUCING A SEMICONDUCTOR DEVICE

(75) Inventor: Kazuhito Hosokawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 67 days.

(21) Appl. No.: 10/923,957

(22) Filed: Aug. 23, 2004

(65) Prior Publication Data

US 2005/0046021 A1    Mar. 3, 2005

(30) Foreign Application Priority Data

Aug. 26, 2003 (JP) ............... 2003-301334

(51) Int. Cl.
*H01L 23/06* (2006.01)
*H01L 23/48* (2006.01)
*H01L 23/52* (2006.01)
*H01L 23/29* (2006.01)
*H01L 23/28* (2006.01)

(52) U.S. Cl. ............... 257/729; 257/753; 257/783; 257/787; 257/788; 257/789; 257/790; 257/791; 257/792; 257/793; 257/794; 257/795; 257/796; 257/798

(58) Field of Classification Search ............... 257/753, 257/787–796, 798, 729, 783
See application file for complete search history.

(56) References Cited

U.S. PATENT DOCUMENTS

| | | | | |
|---|---|---|---|---|
| 5,843,251 A * | 12/1998 | Tsukagoshi et al. | ........... | 156/64 |
| 6,114,753 A * | 9/2000 | Nagai et al. | ................ | 257/668 |
| 6,166,897 A * | 12/2000 | Matsunaga | ................ | 361/234 |
| 6,200,830 B1 * | 3/2001 | Ito et al. | ...................... | 438/106 |
| 6,281,450 B1 * | 8/2001 | Urasaki et al. | ............. | 174/261 |
| 6,303,219 B1 * | 10/2001 | Sawamura et al. | ......... | 428/343 |
| 6,475,629 B1 * | 11/2002 | Takeuchi et al. | ............ | 428/450 |
| 6,498,392 B1 | 12/2002 | Azuma | ........................ | 257/676 |
| 6,534,723 B1 * | 3/2003 | Asai et al. | ................... | 174/255 |
| 6,586,089 B1 * | 7/2003 | Golden | ........................ | 428/346 |
| 6,621,170 B1 * | 9/2003 | Yamamoto et al. | ......... | 257/783 |
| 6,683,298 B1 | 1/2004 | Hunter et al. | ................ | 250/239 |
| 6,716,529 B1 * | 4/2004 | Sawamura et al. | ......... | 428/413 |
| 6,838,170 B1 * | 1/2005 | Tanaka et al. | ......... | 428/355 EP |
| 2002/0146864 A1 | 10/2002 | Miyaki et al. | ................ | 438/123 |
| 2002/0160127 A1 * | 10/2002 | Sakata et al. | ................ | 428/1.6 |
| 2003/0006508 A1 * | 1/2003 | Ikezawa et al. | ............. | 257/777 |

(Continued)

FOREIGN PATENT DOCUMENTS

| | | |
|---|---|---|
| JP | 9-252014 | 9/1997 |
| JP | 2001-210743 | 8/2001 |
| JP | 2002-110884 | 4/2002 |

*Primary Examiner*—Ida M. Soward
(74) *Attorney, Agent, or Firm*—Knobbe Martens Olson & Bear LLP

(57) ABSTRACT

An adhesive sheet for producing a semiconductor device, which includes a base layer and an adhesive layer and is used in the process for producing the semiconductor device including the step of sealing a semiconductor element connected to an electric conductor with a sealing resin on the adhesive layer, wherein the adhesive layer of the adhesive sheet includes a rubber component and an epoxy resin component and the ratio of the rubber component in organic materials in the adhesive layer is from 5 to 40% by weight. According to this adhesive sheet, pollution is not caused by silicon components, a sufficient elastic modulus can be kept even at high temperature, and a problem that paste remains is not easily caused.

19 Claims, 13 Drawing Sheets

U.S. PATENT DOCUMENTS

| | | |
|---|---|---|
| 2003/0031867 A1* | 2/2003 | Ogura et al. ............ 428/355 R |
| 2003/0092253 A1 | 5/2003 | Yamaguchi ................ 438/613 |
| 2003/0170450 A1* | 9/2003 | Stewart et al. ............. 428/343 |
| 2003/0190466 A1* | 10/2003 | Nakaba et al. .............. 428/344 |
| 2004/0018659 A1* | 1/2004 | Hosokawa et al. ......... 438/106 |
| 2004/0224149 A1* | 11/2004 | Nagai et al. ................ 428/343 |

* cited by examiner

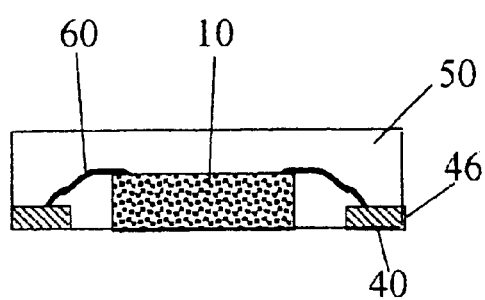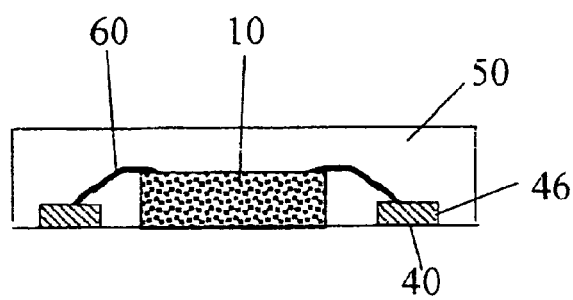

ADHESIVE SHEET FOR PRODUCING A SEMICONDUCTOR DEVICE

FIELD OF THE INVENTION

The present invention relates to an adhesive sheet which comprises a base layer and an adhesive layer and is used in the process for producing a semiconductor device comprising the step of sealing a semiconductor element connected to an electric conductor with a sealing resin on the adhesive layer.

BACKGROUND OF THE INVENTION

In recent years, attention has paid to CSP (chip on size/scale package) techniques in LSI-mounting technology. Of these techniques, a package wherein lead terminals are taken in a package, a typical example of which is a QFN (quad flat non-leaded package), is one package form which is particularly notable from the viewpoint that the package can be made small-sized and the integration degree of semiconductor elements therein can be made high. Of processes for producing such QFNs, especial attention has been paid in recent years to a process of arranging a plurality of chips for QFNs in good order on die pads in package pattern areas of a lead frame, sealing them with a sealing resin, in a lump, inside a cavity made in a mold, and then cutting the resultant to be divided into individual QFN structures, thereby improving the productivity of the semiconductor elements per the lead frame area drastically.

According to such a process for producing QFNs, wherein plural semiconductor chips are sealed in a lump, the area which is clamped with a molding die when the chips are sealed with a resin is only the outside of a resin-sealing area which spreads to the outside of a package pattern area. Accordingly, in the package pattern area, in particular, at the center thereof, the outer lead face thereof cannot be pressed against the molding die with a sufficient pressure. Thus, it is very difficult to suppress the phenomenon that the sealing resin leaks out to the outer lead side. As a result, a problem that terminals of the QFNs are covered with the resin is easily caused.

Against a QFN-producing process as described above, therefore, a production process is known wherein a pressure-sensitive adhesive tape is adhered onto the outer lead side of a lead frame and at the time of sealing chips with a resin the leakage of the resin to the outer lead side is prevented on the basis of sealing-effect using the self-adhesive force of this pressure-sensitive adhesive tape (i.e., masking with the tape) (see, for example, Japanese Patent Application Laid-Open (JP-A) No. 2002-110884).

In this production process or the like, it is desired that the heat-resistant pressure-sensitive adhesive tape is adhered onto the outer pad face of the lead frame at the first stage and the adhesion is continued from the first stage, via the step of mounting semiconductor chips and the step of wire bonding, to the step of sealing the chips using the sealing resin. It is therefore necessary for the heat-resistant pressure-sensitive adhesive tape to have not only a characteristic that the adhesive tape prevents the leakage-out of the sealing resin but also characteristics satisfying all of the above-mentioned steps, for example, characteristics that the tape has a high heat resistance for resisting the step of mounting the semiconductor chips; the tape does not hinder delicate operation in the wire bonding step; and the tape can be satisfactorily peeled without leaving any paste after the end of the sealing step.

In recent years, disclosed was a process for producing the so-called leadless semiconductor device, wherein a copper foil is adhered onto a pressure-sensitive adhesive tape and then the foil is etched to form an electric conductor in order to make the electric conductor thinner (see, for example, JP-A No. 9-252014). According to this process, the electric conductor can be made thin since the conductor is formed on the tape. In the case of dividing the semiconductor device molded with a sealing resin into individual pieces, it is unnecessary to cut any lead frame. Therefore, at the time of dicing the semiconductor device with a blade, the blade is less worn away.

It is necessary for the heat-resistant pressure-sensitive adhesive tape used for such a purpose to have the same characteristics as in the case of using a lead frame, that is, to have not only a characteristic that the adhesive tape prevents the leakage-out of the sealing resin but also characteristics satisfying all of the above-mentioned steps, for example, characteristics that the tape has a high heat resistance for resisting the step of mounting semiconductor chips; the tape does not hinder delicate operation in the wire bonding step; and the tape can be satisfactorily peeled without leaving any paste after the end of the sealing step.

As a heat-resistant pressure-sensitive adhesive tape having characteristics as described above, a silicone based pressure-sensitive adhesive agent is generally used since the agent has excellent heat resistance and further has appropriate elastic modulus and adhesiveness.

However, it has been proved that when a silicone base pressure-sensitive adhesive agent is used as the heat-resistant tape, the following problems 1) and 2) are caused: 1) The silicone based pressure-sensitive adhesive agent of the heat-resistant pressure-sensitive adhesive tape is shifted to the outer pad portion and pollutes the surface thereof when the tape is peeled after the above-mentioned successive steps. As a result, when the semiconductor device is soldered onto the mounting substrate, the wettability thereof gets bad so that the mounting yield is lowered. 2) In order to obtain a good metal joint between wires and the lead pads in the wire bonding step, they may be heated to about 200° C. In the case of using the silicone based adhesive tape, siloxane gas is generated to pollute the surfaces of the lead pads. Additionally, a decline of the elastic modulus of the pads causes the wire bondability to be lowered.

In the case that a silicone pressure-sensitive adhesive agent is used in a leadless production process as disclosed in the above-mentioned JP-A No. 9-252014, the silicone pressure-sensitive adhesive agent is exposed to chemical agent solution in a wet process in etching and plating steps. Thus, eluted silicone components pollute the surface so as to cause a problem that the wire bondability of the surface is lowered.

SUMMARY OF THE INVENTION

An object of the present invention is to provide an adhesive sheet for producing a semiconductor device, which is not polluted with silicone components, is capable of keeping a sufficient elastic modulus even at high temperature, and does not cause a problem that paste remains.

In order to attain this object, the inventors have made eager investigations. As a result, it has been found out that the use of a specific rubber/epoxy based adhesive agent for a sheet makes it possible to make this sheet up to a sheet which has a high heat resistance after being cured, has an appropriate adhesiveness to metal, is permitted to be satisfactorily peeled, without leaving any paste, from a sealing resin and outer pads after the step of sealing semiconductor chips with the resin, and is not polluted with silicone. Thus, the present invention has been made.

Therefore, the adhesive sheet for producing a semiconductor device of the present invention comprises a base layer and an adhesive layer and is used in the process for producing the semiconductor device comprising the step of sealing a semiconductor element connected to an electric conductor with a sealing resin on the adhesive layer, wherein the adhesive layer of the adhesive sheet comprises a rubber component and an epoxy resin component and the ratio of the rubber component in organic materials in the adhesive layer is from 5 to 40% by weight.

According to the present invention, pollution based on out gas or elution is not caused, since the silicone component is not contained. Moreover, a sufficient elastic modulus can be kept even at high temperatures, and a problem of paste-remains is not easily caused, either, as shown by results of working examples. Additionally, the adhesive layer contains the rubber component in an appropriate amount; flexibility is given to the adhesive agent while the heat resistance is kept. As a result, the workability of the adhesive sheet for cutting and other workings can be improved.

In the above-mentioned sheet, it is preferable that the epoxy resin component has an epoxy equivalent of 1000 g/eq. or less. This makes the crosslink density suitable. More certainly, therefore, the problem of paste-remains can be less caused when the sheet is peeled.

It is also preferable that the tensile storage elastic modulus of the adhesive layer is 1 MPa or more at 200° C. after the adhesive layer is cured. This makes it possible to keep a sufficient elastic modulus more certainly even at high temperatures, so that the yields of wire bonding and others can be improved.

BRIEF DESCRIPTION OF THE DRAWINGS

Additional objects of the present invention, and characteristics and superior points thereof will be sufficiently understood on the basis of the following description. Advantageous effects of the present invention will also be apparent from the following description which refers to the attached drawings.

FIG. 8 is a sectional view of a semiconductor device obtained by a semiconductor device production process (III) related to the present invention;

DESCRIPTION OF THE EMBODIMENTS

Figure 1:
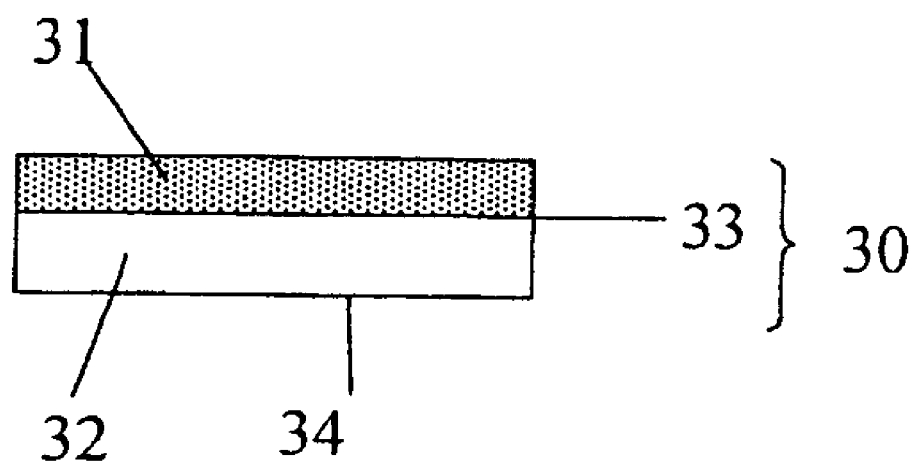
FIG. 1 is a sectional view of an adhesive sheet of the present invention for producing a semiconductor device.

The following specifically describes embodiments of the adhesive sheet of the present invention for producing a semiconductor device, and the semiconductor device with reference to the attached drawings. First, the adhesive sheet of the present invention for producing a semiconductor device is first described. FIG. 1 illustrates a sectional view of an example thereof. As illustrated in FIG. 1, an adhesive sheet 30 of the present invention for producing a semiconductor device has a base layer 32 and an adhesive layer 31. The adhesive layer 31 contains a rubber component and an epoxy resin component.

The used rubber component may be a rubber component which has been conventionally used for an epoxy based adhesive agent, such as NBR (acrylonitrile butadiene rubber), acrylic rubber, acid-terminated nitrile rubber, or thermoplastic elastomer. Examples of the rubber component that is commercially available include products sold as Nipol 1072 (manufactured by Nippon Zeon Co., Ltd.) and Nipol-AR51 (manufactured by Nippon Zeon Co., Ltd.). Of the above-mentioned examples, NBR is preferable from the viewpoint of the compatibility thereof with epoxy resin. NBR containing acrylonitrile at an amount of 10 to 50% is particularly preferable.

The rubber component is added in order to give flexibility to the adhesive agent. However, if the content of the component becomes large, the heat resistance of the adhesive agent falls. Therefore, the ratio of the rubber component in organic materials in the adhesive layer is preferably from 5 to 40% by weight, more preferably from 10 to 30% by weight. If the ratio is less than 5% by weight, the flexibility of the adhesive layer lowers so that the workability of the adhesive sheet for cutting and others deteriorates. If the ratio is more than 40% by weight, the heat resistance of the adhesive layer lowers and paste-remains are easily generated.

The epoxy resin component may be a compound containing in the molecule thereof two or more epoxy groups. Examples thereof include glycidylamine type epoxy resin, bisphenol F type epoxy resin, bisphenol A type epoxy resin, phenol novolac type epoxy resin, cresol novolac type epoxy resin, biphenyl type epoxy resin, naphthalene type epoxy resin, aliphatic epoxy resin, alicyclic epoxy resin, heterocyclic epoxy resin, spiro ring containing epoxy resin, and halogenated epoxy resin. These may be used alone or in a mixture form of two or more thereof. Of these examples, bisphenol A type epoxy resin is preferable from the viewpoint of the peelability thereof from sealing resin after the sealing step.

The ratio of the used epoxy resin in the organic materials is preferably from 60 to 95% by weight, more preferably from 70 to 90% by weight. If the ratio is less than 60% by weight, the sheet is insufficiently cured and the heat resistance thereof is insufficient. If the ratio is more than 95% by weight, the flexibility of the sheet lowers so that the workability deteriorates. The epoxy equivalent of the epoxy resin is 1000 g/eq. or less, preferably 500 g/eq. or less. If the epoxy equivalent is more than 1000 g/eq., the crosslink density of the sheet becomes small. Consequently, the sheet has large adhesive strength after the sheet is cured. Thus, paste-remains are easily generated when the sheet is peeled after the sealing step.

It is preferable to add, to the present invention, a curing agent for curing the epoxy resin, which is a curable component. Examples of the curing agent for curing the epoxy resin include phenol resin, various imidazole compounds and derivatives thereof, hydrazide compounds, dicyandiamide, and products wherein these are micro-encapsulated. In particular, in the case that phenol resin is used as the curing agent, a phosphorus-containing compound such as triphenylphosphine can be used as a curing promoter.

The ratio of the used curing agent is as follows. In the case that phenol resin is selected as the curing agent, a part of the epoxy resin may be substituted with the phenol resin so as to make the equivalent of the phenol resin substantially equal to that of the epoxy resin. The ratio of the curing agent other than phenol resin, plus the curing promoter, in the organic materials is from 0.5 to 5% by weight, preferably from 0.5 to 3% by weight.

About the thermocurable adhesive layer in the present invention, which is prepared to be within the above-mentioned scope, the tensile storage elastic modulus thereof is preferably 1 MPa or more, more preferably 1.5 MPa or more at 200° C. after the layer is cured. If the tensile storage elastic modulus is less than 1 MPa, the wire bondability lowers and paste-remains are easily generated when the sheet is peeled after the sealing step. The method for measuring the tensile storage elastic modulus will be described later.

When the thermocurable adhesive sheet of the present invention is heated at 200° C., the amount of generated siloxane type gas is preferably 1000 ng/g or less, more preferably 500 ng/g or less, even more preferably 100 ng/g or less. If the amount is more than 1000 ng/g, there is a large possibility that the following are caused: the pollution of the surface with silicone; and metal bonding poorness, at the time of wire bonding and soldering, on the basis of transfer of silicone components on the outer pad side.

If necessary, it is allowable to add, to the adhesive layer, known various additives such as an inorganic filler, an organic filler, a pigment, an age resistor, a silane coupling agent, and a tackifier as far as various properties of the adhesive sheet are not deteriorated. In particular, the addition of the age resistor is effective for preventing the deterioration at high temperature.

In the present invention, the composition prepared in this way can be made into an adhesive sheet by an ordinary production process. Examples of the process include a process of dissolving the composition into a solvent, applying the solution onto a base film, and heating and drying the resultant to form an adhesive sheet; and a process of making the composition into an aqueous dispersion, applying the dispersion onto a base film, and heating and drying the resultant to form an adhesive sheet. The kind of the solvent is not particularly limited. A ketone solvent such as methyl ethyl ketone is preferable since the solvent is good in dissolubility.

The base layer 32 is preferably a heat-resistant base. The base may be a plastic base made of polyester, polyamide, polyphenylenesulfide, polyetherimide, polyimide or the like; a porous base made of such a plastic; a paper base such as glassine, fine paper or Japanese paper; a nonwoven cloth base made of cellulose, polyamide, polyester, aramide, or the like; or a metal film base such as aluminum foil, SUS foil, or nickel foil.

The thickness of the base is usually from 10 to 200 μm, preferably from 25 to 100 μm. If the thickness is less than 10 μm, the handling ability thereof lowers. If the thickness is more than 200 μm, costs rise. The adhesive sheet of the present invention for producing a semiconductor device is a sheet wherein an adhesive layer which is produced in this way and usually has a thickness of 1 to 50 μm is formed on a base layer, and is used in the form of a sheet, tape or the like.

If necessary, antistatic function may be given to the adhesive sheet 30. FIG. 1 illustrates a manner for giving antistatic function to the adhesive sheet 30. Examples of the manner for giving antistatic function thereto include a manner of incorporating an antistatic agent or an electroconductive filler into the adhesive layer 31 and the base layer 32; a manner of applying an antistatic agent to the interface 33 between the base layer 32 and the adhesive layer 31 or a rear surface 34 of the base layer 32.

The antistatic function makes it possible to suppress static electricity generated when the adhesive sheet is separated from the semiconductor device. As the antistatic agent, an agent having the above-mentioned antistatic function may be used without any especial limitation. Specific examples thereof include acrylic amphoteric surfactants, acrylic cationic surfactants, and maleic anhydride-styrene based anionic surfactants.

Specific examples of the material for the antistatic layer include products sold as Bondip PA, Bondip PX, and Bondip P (manufactured by Konishi Co., Ltd.). The electroconductive filler may be conventional one. Examples thereof include metals such as Ni, Fe, Cr, Co, Al, Sb, Mo, Cu, Ag, Pt and Au; alloys and oxides thereof; carbon materials such as carbon black. These may be used alone or in combination of two or more thereof. The electroconductive filler may be in any one of powdery and fibrous forms.

The adhesive sheet of the present invention for producing a semiconductor device, which has a structure as described above, is excellent in heat resistance and good in releasability from sealing resin and metal, and contains therein no silicone component; therefore, there are not easily caused poorness in the wettability of the surface at the time of soldering, based on surface pollution with silicone components, bonding poorness in the step of wire bonding, and others. Thus, the adhesive sheet can be suitably used in the process for producing a semiconductor which comprises the step of sealing, with sealing resin, a semiconductor element connected to an electric conductor on an adhesive layer. Specifically, the adhesive sheet can be used in the following production process.

For example, a process (I) for producing a semiconductor device, using a lead frame. This production process (I) comprises the step of sealing the semiconductor device producing adhesive sheet of the present invention, a lead frame and semiconductor elements with a sealing resin in the state that the lead frame having electric conductor portions arranged toward openings is laminated onto the adhesive layer of the adhesive sheet and further the electric conductor portions are connected to the semiconductor elements. In this semiconductor device production process (I), the lead frame can be used as a lead frame laminate, which is beforehand laminated onto the adhesive layer of the adhesive sheet for producing a semiconductor device.

Figure 2A:
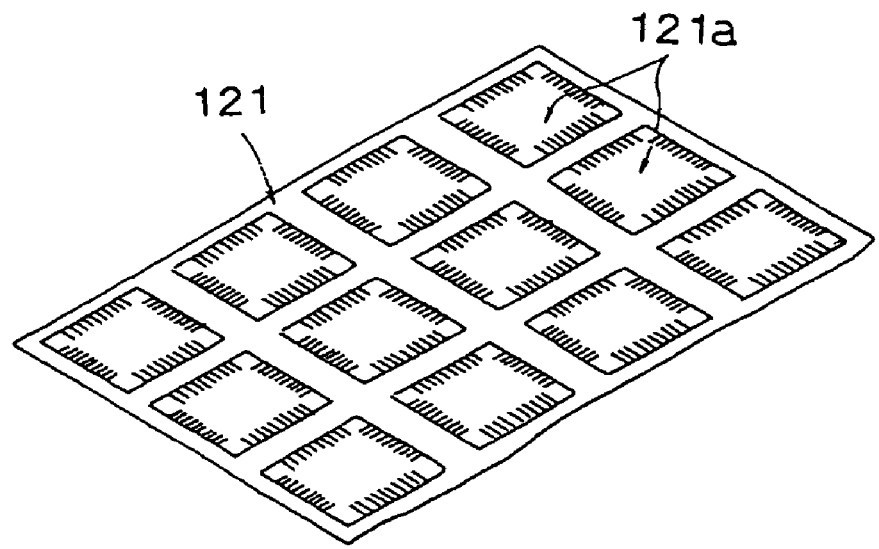
FIGS. 2A and 2B are each an example of a lead frame used in a semiconductor device production process (Ia) related to the present invention.
Figure 2B:
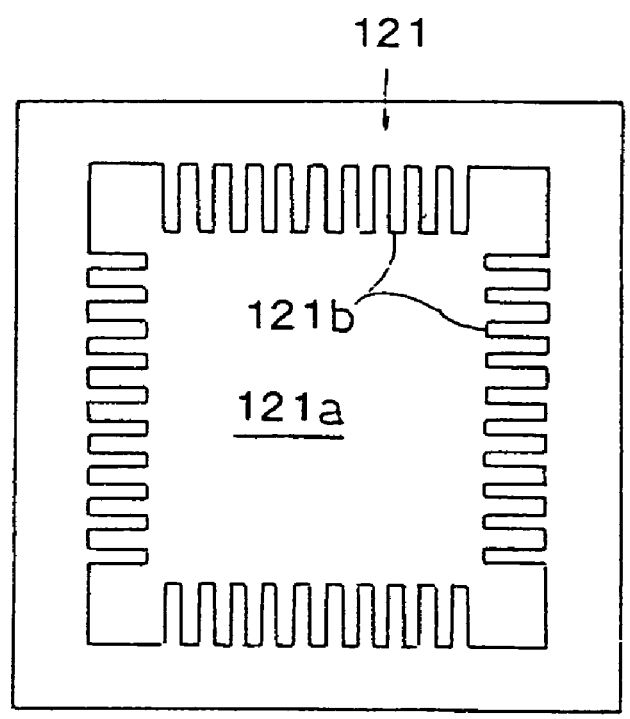

An example (Ia) of the semiconductor device production process (I) is described with reference to FIGS. 2A and 2B, and FIG. 3. FIGS. 2A and 2B each illustrate an example of a lead frame. FIG. 2A is a perspective view illustrating the whole thereof, and FIG. 2B is a plan view of one unit in the lead frame. This lead frame 121, has openings 121a in which semiconductor elements 102 are arranged and connected. Plural terminal portions (electric conductor portions) 121b are arranged toward each of the openings 121a. It is sufficient that at least the terminal portions 121b of the lead frame 121 are made of an electric conductor portion. The whole of the lead frame may be made of an electric conductor portion.

The semiconductor elements 102 are electrically connected to the terminal portions 121b by wire bonding or the like. The semiconductor elements 102 may be connected to the terminal portions 121b when the lead frame is in the state of the above-mentioned lead frame laminate or before the lead frame is made into the lead frame laminate. Accordingly, examples of the lead frame laminate include the lead frame laminate wherein the semiconductor elements 102 are beforehand connected to the terminal portions.

The shapes of the terminal portions 121b or the arrangement thereof are not particularly limited. The shapes are not limited to the illustrated rectangular shapes, and may be patterned shapes or shapes each having a circular portion. The terminal portions 121b may not be arranged along the whole circumferences of the openings 121a, and may be arranged across the whole of the openings 121a or along only opposite two sides of the individual openings 121a.

Figure 3A:
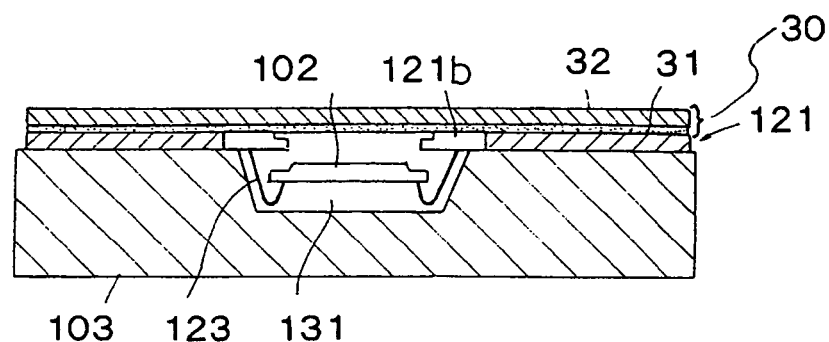
FIGS. 3A to 3C are schematic process charts of the semiconductor device production process (Ia) related to the present invention.
Figure 3B:
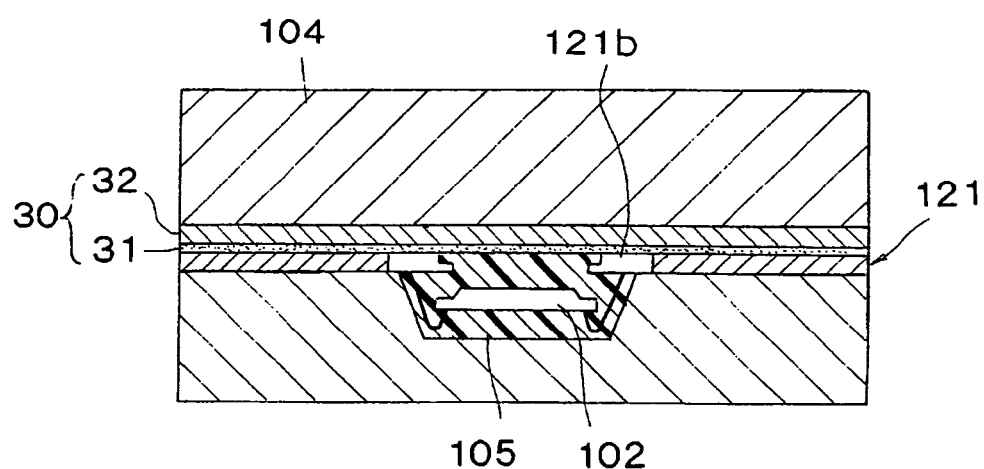
Figure 3C:
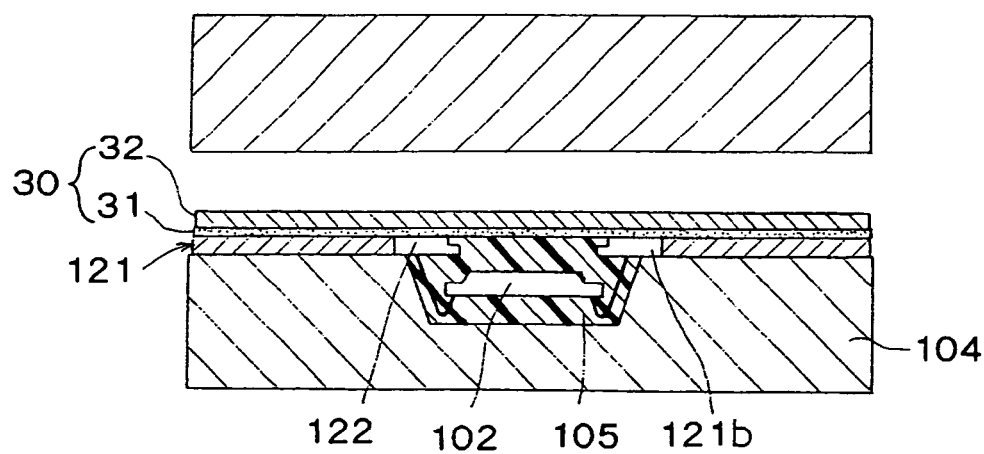

In the semiconductor device production process (Ia), the lead frame wherein the terminal portions arranged toward the openings are made of copper is used to perform a molding step of sealing, with a resin, the terminal portions and the semiconductor elements in the state that the semiconductor elements are connected to the portions (see FIGS. 3A to 3C).

For example, the adhesive sheet 30 is adhered onto the lead frame 121 wherein electrodes of the semiconductor elements 102 are bonded to the terminal portions 121b through wires 123, so as to yield a laminate. As illustrated in FIGS. 3A to 3C, this laminate is used and arranged so as to position the semiconductor elements 102 inside a cavity 131 in a lower mold 103. An upper mold 104 is shifted to close the molds 103 and 104, and then a resin 105 is injected into the cavity 131 and hardened by transfer molding. Next, the molds 103 and 104 are opened. If necessary, a PMC (post mold cure) step is performed in the state that the adhesive sheet 30 is adhered onto the lead frame in a heating device. Thereafter, the adhesive sheet 30 is peeled and removed. Furthermore, a plating step of plating the terminal portions 121b with solder may be performed. Thereafter or at an appropriate stage up to this time, the lead frame 121 is cut by trimming in the state that the terminal portions 121b remain.

An example (Ib) of the semiconductor device production process (I) is described with reference to FIGS. 4A to 6. FIGS. 4A to 4E are process charts of this process (Ib). The process (Ib) comprises the step of using a lead frame laminate wherein the adhesive sheet of the present invention is beforehand adhered to a lead frame to perform the mounting of semiconductor chips, the wire bonding thereof, and the sealing thereof with a sealing resin. As illustrated in FIGS. 4A to 4E, the process (Ib) is an example of a production process, based on package sealing of QFNs, comprising a mounting step of mounting semiconductor chips 215, a connecting step of connecting the chips 215 to terminal portions through bonding wires 216, a sealing step of sealing the whole with a sealing resin 217, and a cutting step of cutting the sealed structure 21.

Figure 4A:
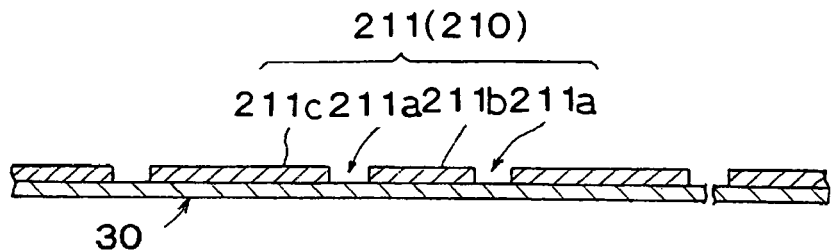
FIGS. 4A to 4E are schematic process charts of a semiconductor device production process (Ib) related to the present invention.
Figure 4B:
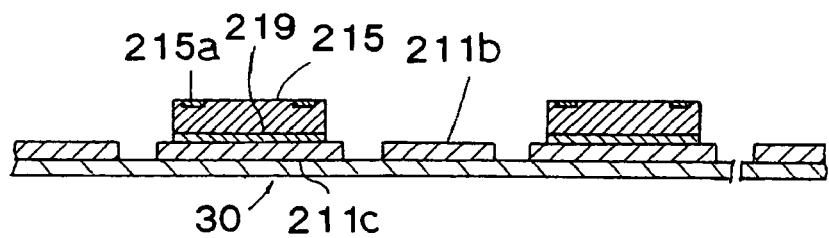

As illustrated in FIGS. 4A and 4B, the mounting step is a step of bonding semiconductor elements 215 to die pads 211c of a lead frame 210 made of metal, an adhesive sheet 30 being adhered onto the outer pad side (in the lower portion in the figures) of the lead frame 210.

The lead frame 210 is a member wherein a terminal pattern for QFNs is engraved on a metal material such as copper. Electric contact portions thereof may be covered (or plated) with a material such as silver, nickel, palladium, or gold.

The lead frame 210 is preferably a member having a pattern wherein individual QFNs are arranged in good order so as to be easily cut and divided in a subsequent cutting step. For example, as illustrated in FIGS. 5A to 5C, a form wherein QFNs are arranged lengthwise and crosswise, or in a matrix form, on the lead frame 210 is called "matrix QFN", "MAP-QFN", or the like, and is one of the most preferable lead frame forms.

Figure 5A:
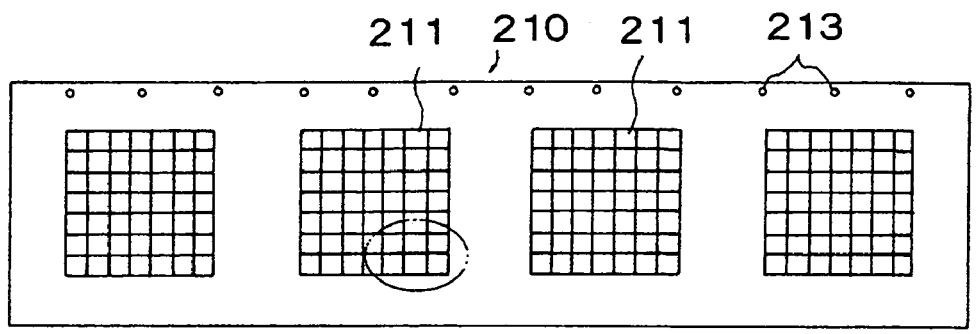
FIGS. 5A to 5C are each an example of a lead frame used in the semiconductor device production process (Ib) related to the present invention.
Figure 5B:
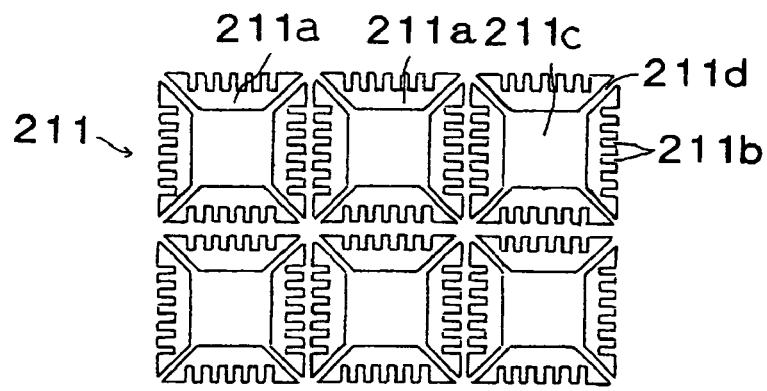
Figure 5C:
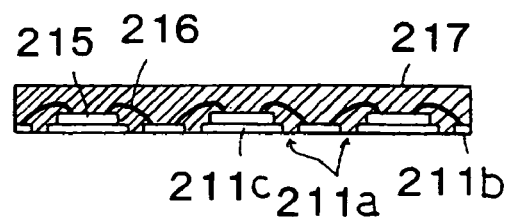

As illustrated in FIGS. 5A and 5B, in a package pattern area 211 of the lead frame 210, substrate designs of the QFNs wherein plural terminal portions 211b are arranged in plural openings 211a adjacent to each other are arranged in good order. In the case that the QFNs are ordinary QFNs, each of the substrate designs, which is an area divided by cross stripes in FIG. 5A, is composed of terminal portions 211b that are arranged along the circumference of one of the openings 211a and have an outer lead face on the lower side, a die pad 211c that is arranged at the center of the opening 211a, and die bars 211d for supporting the die pad 211c at four corners of the opening 211a.

It is preferred that the adhesive sheet 30 is adhered to at least the outside of the package pattern area 211 including the openings 211a and the terminal portions 211b and further adhered to an area including the entire outer circumference of resin-sealing areas, which are to be sealed with resin. The lead frame 210 usually has, near an edge side thereof, holes 213 for guide pins for positioning the lead frame at the time of resin-sealing. Thus, it is preferred to adhere the adhesive sheet 30 to an area where the holes 213 are not to be covered. Since the resin-sealing areas are arranged in the longitudinal direction of the lead frame 210, it is preferred to adhere successively the adhesive sheet 30 so as to extend over these areas.

The semiconductor elements 215, that is, silicone wafer chips, which are semiconductor-integrated circuit portions, are mounted on the lead frame 210. Fixing areas for fixing the semiconductor elements 215 are formed on the lead frame 210, the areas being called die pads 211c. The method for bonding (or fixing) the semiconductor elements onto the die pads 211c may be a method of using an electroconductive paste 219, an adhesive tape or an adhesive agent, or any other method. In the case of using an electroconductive paste, a thermocurable adhesive agent or the like to perform the die bonding, this paste or the like is generally heated and cured at a temperature of about 150 to 200° C. for about 30 to 90 minutes.

Figure 4C:
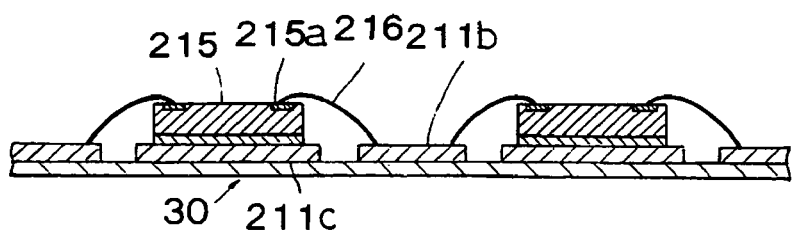

As illustrated in FIG. 4C, the connecting step is a step of connecting the tip of each of the terminal portions 211b (inner leads) of the lead frame 210 electrically to an electrode pad 215a of each of the semiconductor elements 215 through a bonding wire 216. The bonding wire 216 may be, for example, a gold wire, an aluminum wire or the like. In general, the connection is attained using vibration energy based on ultrasonic waves and compression energy based on pressurization under conditions heated to 160 to 230° C. At this time, the surface of the adhesive sheet 30 adhered to the lead frame 210 is subjected to vacuum suction, whereby the heat blocks can be surely fixed.

Figure 4D:
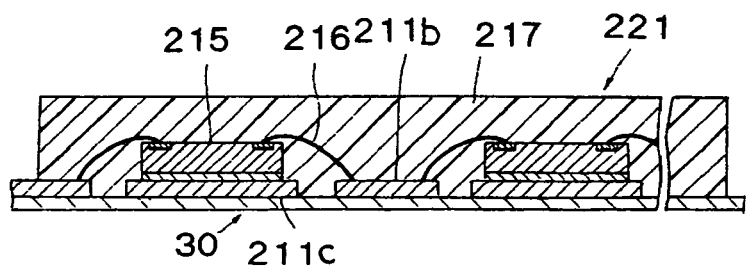
Figure 6:
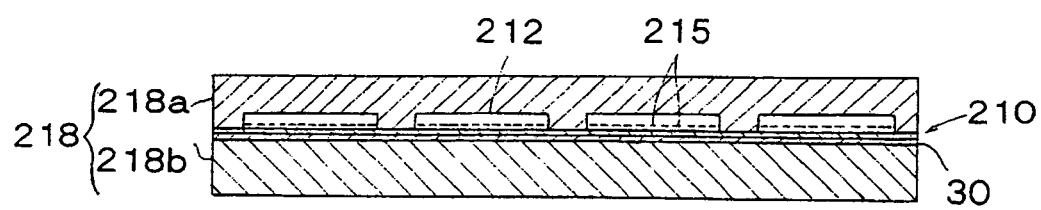
FIG. 6 is a sectional view illustrating an example of a resin-sealing step in the semiconductor device production process (Ib) related to the present invention.

As illustrated in FIG. 4D, the sealing step is a step of sealing one surface of the lead frame 210, i.e., the semiconductor chip side surface thereof with a sealing resin 217. The sealing step is performed to protect the semiconductor elements 215 mounted on the lead frame 210, and bonding wires 216. Typically, the sealing resin 217, a typical example of which is an epoxy resin, is molded in a mold. As illustrated in FIG. 6, at this time, the following is generally performed: a mold 218, which is composed of an upper mold 218a and a lower mold 218b and can give plural cavities, is used to perform the sealing step at a time, using plural lumps of the sealing resin 217. Specifically, the heating temperature at the time of the resin-sealing is from 170 to 180° C., and at this temperature the resin is cured for several minutes. Thereafter, post mold curing is performed for several hours. The adhesive sheet 30 is preferably peeled before the post mold curing.

Figure 4E:
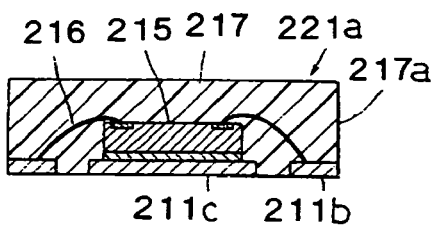

As illustrated in FIG. 4E, the cutting step is a step of cutting the sealed structure 221 into individual semiconductor devices 221a. In general, this step may be a cutting step of using a rotating cutting edge such as a dicer to cut cutting portions 217a of the sealing resin 217.

For the adhesion (or lamination) of the adhesive sheet 30 to the lead frame 210, various laminators provided with a nip roller for adhering the two to each other by nip pressure can be used.

The above-mentioned embodiment is an example of the production process based on package-sealing of QFNs. The production process (1b) may be a process of sealing QFNs separately. In this case, individual semiconductor chips are arranged in separate cavities, and the chips are sealed with plural lumps of a sealing resin. The above-mentioned embodiment is an example of the process of performing the mounting and electrical connection of semiconductor chips by bonding the chips on die pads and wire bonding. However, the mounting step or the connecting step may be changed in accordance with the kind of the package. The mounting and the electrical connection may be simultaneously performed.

The above has described the semiconductor device production process (I) using a lead frame. The adhesive sheet of the present invention for producing a semiconductor device can be applied to processes (II) and (III) for producing a semiconductor which can be made thin and has a leadless structure.

The semiconductor device production process (II) comprises the step (1) of forming electroconductive portions on some areas in an adhesive layer of an adhesive sheet for producing a semiconductor device, the step (2a) of fixing and bonding at least one semiconductor element on a surface of which an electrode is formed onto a given position of the electroconductive portions so as to turn the surface side of the semiconductor element wherein no electrode is formed toward the side of the adhesive layer, the step (3) of connecting the electroconductive portions to which the semiconductor element is not fixed or bonded electrically to the electrode of the semiconductor element through a wire, the step (4) of sealing the semiconductor element and the others with a sealing resin to form a semiconductor device on the adhesive sheet, and the step (5) of separating the adhesive sheet from the semiconductor device.

Figure 7:
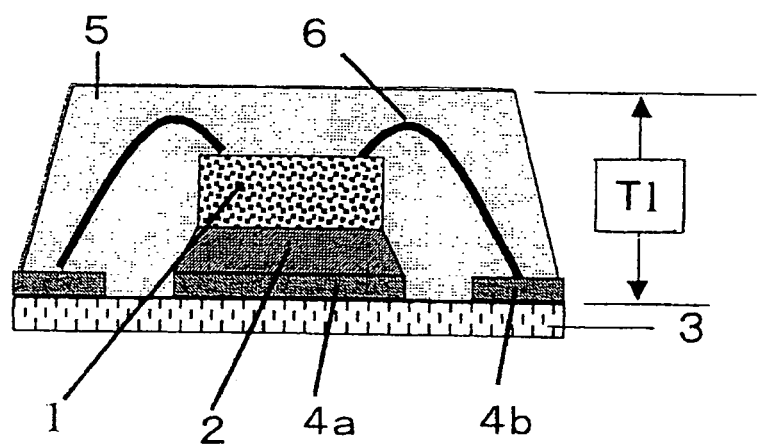
FIG. 7 is a sectional view of a semiconductor device obtained by a semiconductor device production process (II) related to the present invention.

This semiconductor device production process (II) is described in, for example, JP-A No. 9-252014. An example of the semiconductor device obtained by the production process (II) is illustrated in FIG. 7. In this semiconductor device production process (II), a metal foil is first adhered onto an adhesive sheet 30 (or an adhesive layer 31), which is a base, and then the metal foil is etched to leave the metal foil in given areas (step (1)). Next, an adhesive agent 2 is used to fix and bond a semiconductor element 1 on a metal foil 4a (die pad) having a size equivalent to that of the semiconductor element 1 (step (2a)). Furthermore, the semiconductor element 1 and a metal foil 4b are electrically connected to each other through a wire 6 (step (3)). Next, a mold is used to subject a sealing resin 5 to transfer molding (step (4)). Finally, the molded sealing resin is separated from the base 3 (step (5)), thereby finishing a package of the semiconductor element.

The other process (III) for producing a semiconductor device having a leadless structure comprises the step (1) of forming electroconductive portions on some areas in an adhesive layer of the adhesive sheet for producing a semiconductor device, the step (2b) of fixing and bonding at least one semiconductor element on a surface of which an electrode is formed onto the adhesive layer so as to turn the surface side of the semiconductor element wherein no electrode is formed toward the side of the adhesive layer, the step (3) of connecting the electroconductive portions electrically to the electrode of the semiconductor element through a wire, the step (4) of sealing the semiconductor element and the others with a sealing resin to form a semiconductor device on the adhesive sheet, and the step (5) of separating the adhesive sheet from the semiconductor device.

This semiconductor device production process (III) is described in Japanese Patent Application No. 2002-217680.

The following describes embodiments of the semiconductor device production process (III), related to the present invention, specifically with the reference to the attached drawings. First, the structure of a semiconductor device obtained by the production process (III) is described. FIGS. 8A and 8B each illustrate a section of the semiconductor device.

A semiconductor element 10 is electrically connected to electroconductive portions 40 through wires 60. An electrode (not illustrated) is formed on the top of the semiconductor element 10. The semiconductor element 10, the wires 60 and others are sealed with a sealing resin 50 in order to be protected from the external environment. The bottom faces of the semiconductor element 10 and the electroconductive portions 40 are naked to a surface of the resin molded body obtained from the sealing resin 50. The surface side of the semiconductor element 10 wherein no electrode is formed (i.e., the non-electrode-formed side of the semiconductor element 10) and the side of the electroconductive portions 40 which is not connected to the wires are formed on the same plane. In this manner, the semiconductor device related to the present invention has a structure having neither any die pad nor any adhesive layer for fixing and bonding the semiconductor element.

Details of differences between FIGS. 8A and 8B will be described later. In FIG. 8A side faces 46 of the electroconductive portions 40 are naked while in FIG. 8B side faces 46 of the electroconductive portions 40 are embedded in the sealing resin 50. This point is different.

In conventional semiconductor devices, the thickness of die pads thereof is generally from 100 to 200 μm, and the thickness of the adhesive layer for fixing and bonding a semiconductor element is generally from 10 to 50 μm. Therefore, when thicknesses of semiconductor elements are the same and the thicknesses of sealing resins covering the semiconductor elements are the same, the thickness of the semiconductor device related to the present invention can be made 110 to 250 μm smaller. An example of the structure of a semiconductor device is a semiconductor device structure wherein an electrode for mounting an semiconductor device on a circuit board is present below the semiconductor device, for example, the semiconductor device structure (illustrated in FIG. 7) obtained by the production process (II). In this semiconductor device structure, the thickness T1 is generally from 300 to 700 μm. Thus, the influence of the thinning effect based on the present invention is very large.

The following describes an example of the outline of each of steps (1) to (5) in the process, related to the present invention, for producing a semiconductor device with reference to FIGS. 9A to 9H.

Figure 9A:
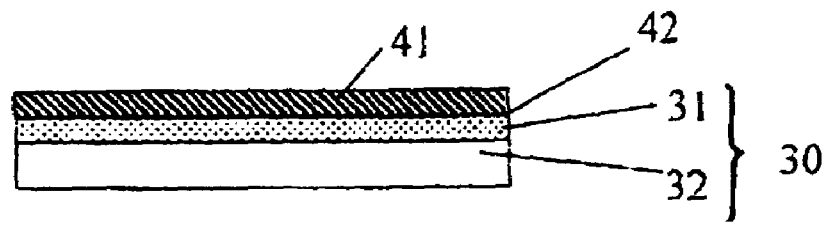
FIGS. 9A to 9H are schematic process charts of the semiconductor device production process (III) related to the present invention.
Figure 9B:
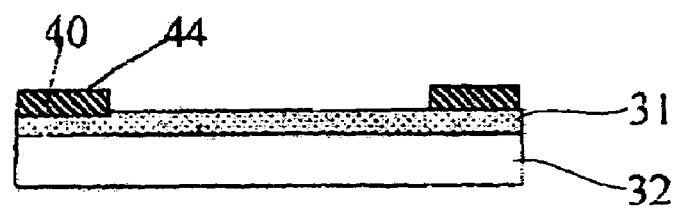

First, the step (1) is described wherein plural electroconductive portions 40 are formed on some areas in an adhesive layer 31 of an adhesive sheet 30, which has a base layer 32 besides the adhesive layer 31. The method for carrying out the step (1) for forming the electroconductive portions 40 is not particularly limited, and can be adopted from various methods. For example, as illustrated in FIG. 9A, a metal foil 41 is adhered onto the adhesive layer 31 of the adhesive sheet 30. As illustrated in FIG. 9B, next, the electroconductive portions 40 can be formed by a pattern etching method using photolithography that is conventionally used. As the metal foil 41, a metal foil that is ordinarily used in the semiconductor industry may be used without any especial limitation. The metal foil may be, for example, a copper foil, copper-nickel alloy foil, Fe-nickel alloy foil, or Fe-nickel-cobalt alloy foil. If necessary, a face 42 in which the metal foil 41 contacts the adhesive layer 31 may be subjected to surface treatment suitable for a mounting manner used when a semiconductor device is mounted on a substrate and so on.

Figure 10:
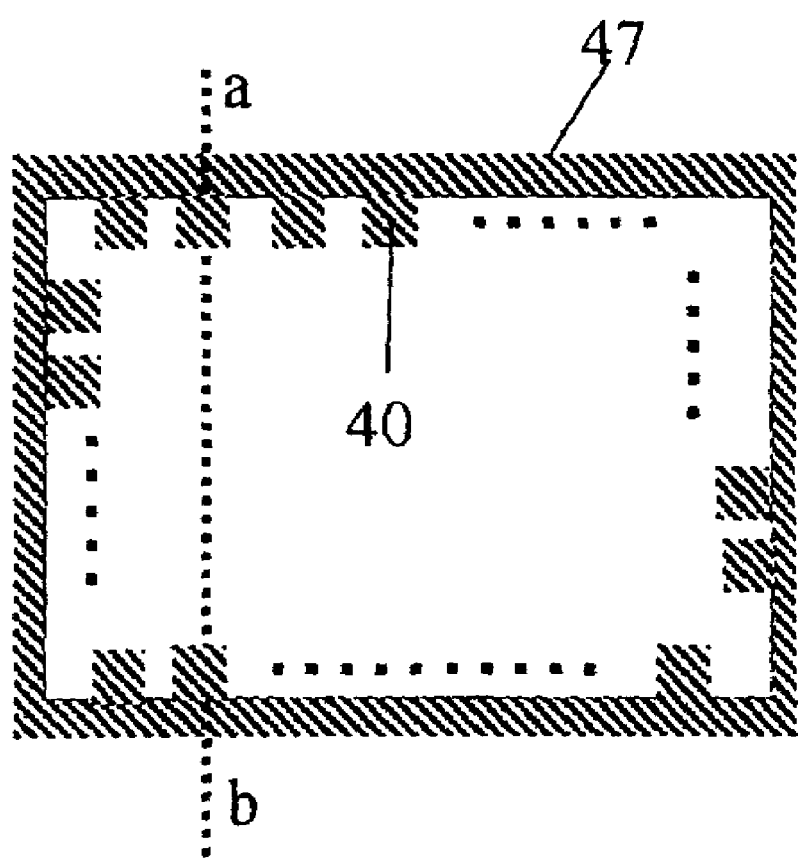
FIG. 10 is a schematic top view of a semiconductor device obtained by the semiconductor device production process (III) related to the present invention.

FIG. 10 is a schematic plan view of the arrangement of the electroconductive portions 40 when the electroconductive portions 40 are formed. The electroconductive portions 40, the number of which corresponds to the number of electrodes of at least one semiconductor 10 (one semiconductor 10 in the present example), are formed. The electroconductive portions 40 can be electrically connected to each other through a plating lead 47 for electroplating. A section cut on a broken line a–b in FIG. 10 is illustrated in FIG. 9B.

Figure 9C:
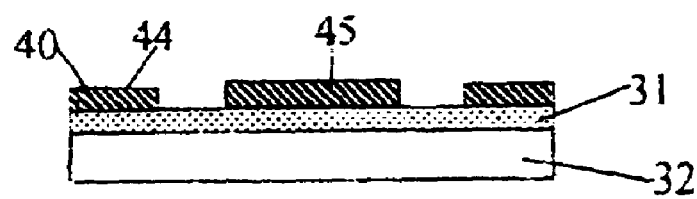
Figure 9D:
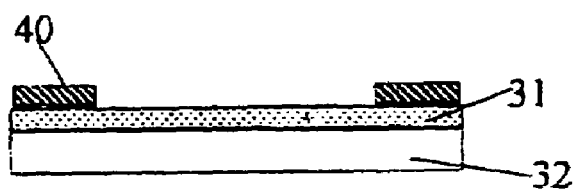
Figure 9E:
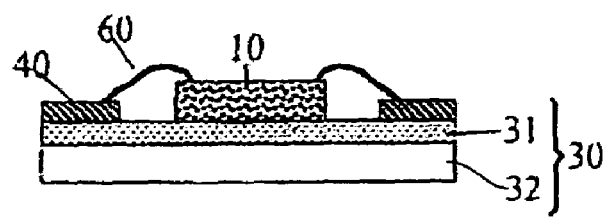

Next, the semiconductor element 10 having the formed electrodes is fixed and bonded to the adhesive layer 31 so as to turn the surface side of the semiconductor element 10 wherein the electrodes of the semiconductor element 10 are not formed toward the side of the adhesive layer 31 (step (2b)). Furthermore, the electroconductive portions 40 are electrically connected to the electrodes of the semiconductor element 10 through wires 6 (step (3)). These steps (2b) and (3) are illustrated in FIG. 9E.

Before the step (2b), the above-mentioned plating lead 47 may be used to subject surfaces 44 of the electroconductive portions 40 to electroplating optimal for wire bonding. In general, Ni plating is conducted, and then gold plating is applied onto the Ni plate. However, this is not restrictive.

Figure 9F:
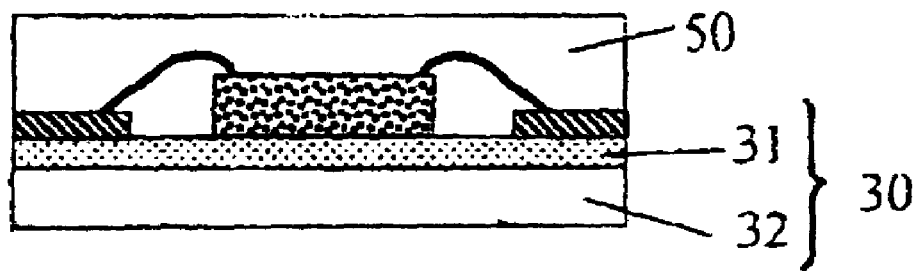

Next, the semiconductor element 10 and so on are sealed with a sealing resin 50, so as to form a semiconductor device on the adhesive layer 31 of the adhesive sheet 30 (step (4)). The sealing with the sealing resin 50 can be performed by ordinary transfer molding using a mold. This step (4) is illustrated in FIG. 9F. If necessary, the molded resin may be heated so as to be post-cured after the transfer molding. The heating and the post-curing may be performed before the step (5) of separating the adhesive sheet 30, which will be described below.

Figure 9G:
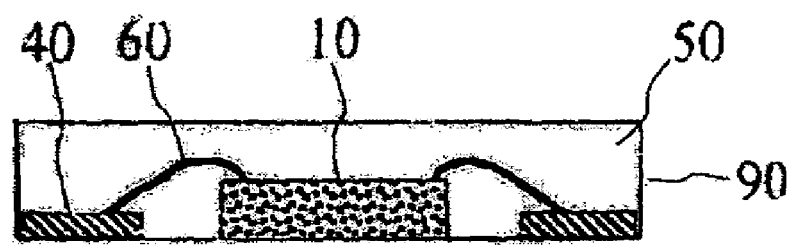
Figure 9H:
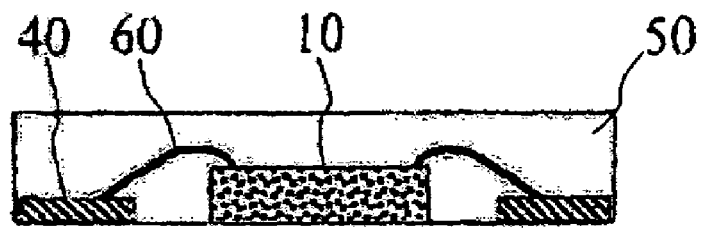

Next, the adhesive sheet 30 is separated from the semiconductor device (step (5)), thereby yielding a semiconductor device 90. This step (5) is illustrated in FIG. 9G. In the case of using the plating lead 47, the plating lead is cut to obtain the semiconductor device, as illustrated in FIG. 9H. The thus-obtained semiconductor device corresponds to a device illustrated in FIG. 8A. The cutting of the plating lead 47 may be performed before the adhesive sheet 30 is separated or after the adhesive sheet 30 is separated.

The semiconductor device of the present invention can be produced in the order of FIGS. 9A, 9B, 9E, 9F, 9G and 9H. In connection with this, it is preferable to form a protective layer 45 on the adhesive layer 31 in the area where the semiconductor element 10 is to be adhered and bonded before the step (2b), as illustrated in FIG. 9C. The formation of the protective layer 45 favorably makes it possible to prevent foreign substance from being inserted and fixed between the semiconductor element 10 and the adhesive layer 31.

The protective layer 45 can be formed by using, for example, etching for obtaining the patterned metal foil 41. In FIG. 9B, related to the step (1), out of FIGS. 9A to 9H, in the step of etching for obtaining the patterned metal foil 41, a metal foil 41 in the area where the semiconductor element 10 is to be fixed and bonded is also etched and removed. As illustrated in FIG. 9C, however, in the etching step of obtaining the patterned metal foil, the metal foil in the area where the semiconductor element 10 is to be fixed and bonded is left as a metal foil 45 without being removed by the etching, whereby the metal foil 45 can be made up to the protective layer. Thereafter, the metal foil 45 is peeled in the step (2b), as illustrated in FIG. 9D. The means for peeling the protective layer 45(metal foil 45) is not particularly limited, and may be adopted from various means. Thereafter, the semiconductor device 90 can be obtained in the same way as illustrated in FIGS. 9E to 9F.

When the surfaces 44 of the electroconductive portions 40 are subjected to electroplating, the metal foil 45 protecting in the area where the semiconductor element 10 is to be fixed and bonded may be electrically connected to the plating lead so as to make the electroplating possible, or may not be electrically connected to the plating lead. In the case that no electric potential is applied in the electroplating step, components of the metal foil 45 may elute into the plating solution. Therefore, the metal foil 45 is preferably plated.

The method for forming the protective layer 45 before the step (2b) may be a method of printing a protective film on the adhesive layer 31 after the step illustrated in FIG. 9B besides the above-mentioned etching method. However, according to this printing method, the number of steps may increase. It is therefore preferable that the metal foil 45 formed by the etching method is used as the protective layer 45.

With the reference to FIGS. 9A to 9H and FIG. 10, the case that electroplating is used as the method for plating the surfaces 44 of the electroconductive portions 40 has been described. However, the plating treatment is not limited to the electroplating, and may be electroless plating. According to the electroless plating, the above-mentioned plating lead 47 is unnecessary. The electroconductive portions 40 are present to be electrically separated from each other. It is therefore unnecessary to cut any plating lead after the formation of the molded resin in the step (4). The thus-obtained semiconductor device corresponds to a semiconductor device illustrated FIG. 8B. In electroless plating, generally it is necessary to separately protect any area where a plating layer is not desired to be formed from being plated. As a result, the number of steps increases. Thus, the electroplating is preferable.

The semiconductor device producing process illustrated FIGS. 9A to 9H is a process wherein the step of adhering the metal foil 41 onto the adhesive layer 31 is used as the step (1) of forming the plural electroconductive portions on some areas in the adhesive layer 31 of the adhesive sheet 30. However, the method for forming the metal foil onto the adhesive layer 31 may be a plating method. The metal foil 41 can be formed, for example, by plating the entire surface of the adhesive layer 31 with a metal by electroless plating, so as to give a thin plating (electroless plating thickness: 0.05 to 3 μm in general), and then forming a thickness required for the metal foil by electroplating. Besides, the metal foil 41 can be formed by a method of forming a thin metal layer, which usually has a thickness of about 0.05 to 3 μm, by vapor deposition or sputtering, and subsequently forming a thickness required for the metal foil by electroplating.

A pattern of electroconductive portions having necessary shapes and a necessary number can be formed in a photosensitive resist layer through the step of forming the resist on the adhesive layer 31 of the adhesive sheet 30 and using ordinary photolithography to perform light-exposure, through an exposure mask having optical portions corresponding to the electroconductive portions having the necessary shapes and the necessary number, followed by development. At this time, the exposure mask is in the state that the mask is formed to connect the electroconductive portions 40 electrically to each other through the plating lead, whereby the electroconductive portions 40 can be subjected to electroplating. Thereafter, a thin plating layer is formed by electroless plating. (In general, the thickness of an electroless plating is from about 0.05 to 3 μm.) After the electroless plating, the resist layer is peeled an then the plating lead is used to perform electroplating until a necessary thickness is obtained. In this way, the electroconductive portions 40 are finally formed.

A metal layer 41 is formed into a very small thickness (commonly, a thickness of about 0.05 to 3 μm) on the adhesive layer 31 of the adhesive sheet 30 by vapor deposition or sputtering, and then a photosensitive resist layer is formed on the metal layer 41. Ordinary photolithography is used to make it possible to form a pattern of electroconductive portions having necessary shapes and a necessary number in the resist layer through the step of performing light-exposure, through an exposure mask having optical portions corresponding to the electroconductive portions having the necessary shapes and the necessary number, followed by development. At this time, the electroconductive portions 40 are electrically connected to each other through a plating lead, so that the electroconductive portions 40 can be electroplated. Thereafter, the plating lead is used to perform electroplating until a necessary thickness is obtained. The resist layer is then peeled, and subsequently the thin metal layer 41, which is formed by vapor deposition or sputtering, is removed by soft etching, so as to obtain electroconductive portions 43. This method may be adopted. In this method, instead of the manner of obtaining the very thin metal layer 41 by vapor deposition or sputtering, there can be used a manner of adhering a thin foil, such as a copper foil (trade name: Micro Thin, thickness: 3 μm) manufactured by Mitsui Mining and Smelting Co., Ltd., onto the adhesive layer 31 of the adhesive sheet 30.

In FIGS. 11A to 11H are shown a method of forming the electroconductive portions 40 by press working in order to perform the step (1) of forming the electroconductive portions on some parts in the adhesive layer 31 of the adhesive sheet 30. FIGS. 11A, 11B, 11D, and 11G show an example of the case that no protective layer is formed on the adhesive layer 31 before the step (2b). FIGS. 11A, 11C, 11E, 11F and 11H show an example of the case that a protective layer is formed on the adhesive layer 31 before the step (2b).

Figure 11A:
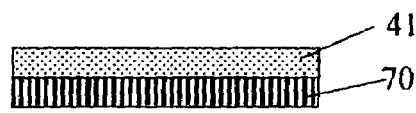
FIGS. 11A to 11H are views illustrating another example of a step (1) in the semiconductor device production process (III) related to the present invention.
Figure 11B:
Figure 11C:
Figure 11D:
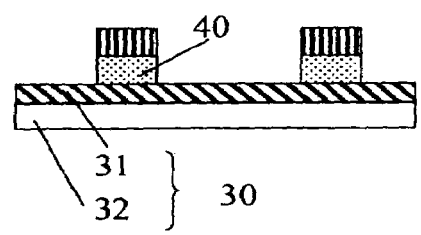
Figure 11E:
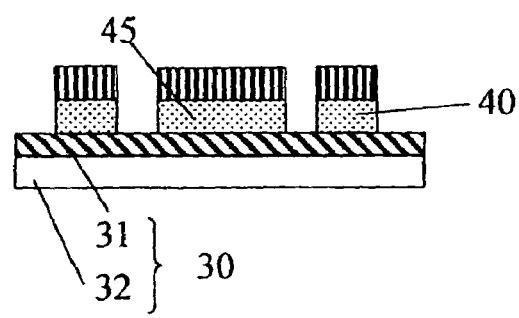
Figure 11F:
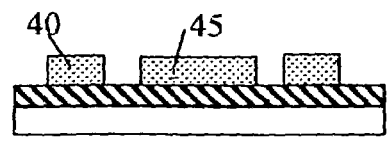
Figure 11G:
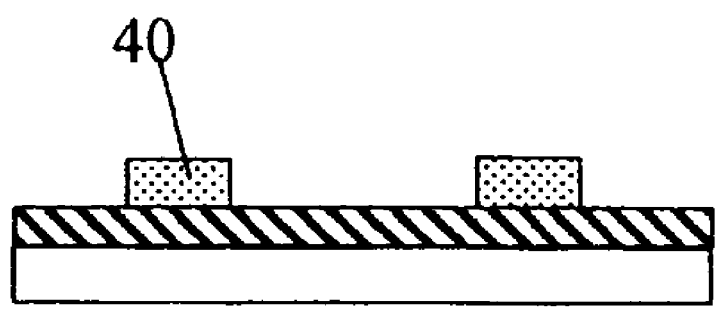
Figure 11H:
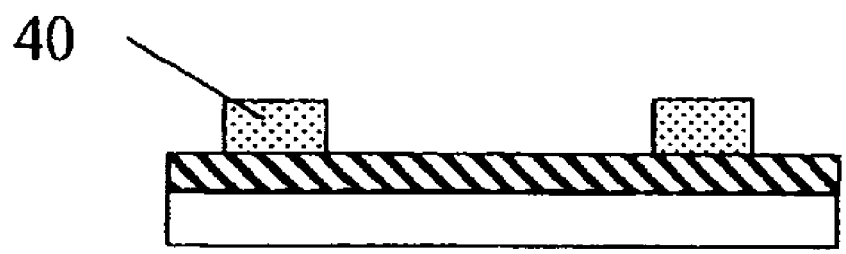

First, a metal foil 41 is adhered onto a process film 70, as illustrated in FIG. 11A. Next, the metal foil 41 is press-worked into a given pattern, as illustrated in FIGS. 11B and 11C. Thereafter, the metal foil 41 side of the process film 70 is adhered onto the adhesive layer 31 of the adhesive sheet 30. Thereafter, the process film 70 is peeled to form the electroconductive portions 40, as illustrated in FIGS. 11G and 11H. A metal foil 45 shown in FIG. 11F is a protective layer for protecting areas where electric conductor elements are fixed and bonded before the step (2b).

In order to transfer the electroconductive portions 40 or the metal foil 45 onto the adhesive sheet 30 after the press-working, the process film 70 is preferably an adhesive sheet having weak adhesiveness or an adhesive sheet having adhesiveness that can be lowered by heating, an electron beam, ultraviolet rays, or some other energy. In particular, when fine working is performed, the adhesive area of the adhesive sheet becomes small; therefore, the adhesive sheet preferably has a strong adhesiveness at the time of the working but has a weak adhesiveness at the time of the transferring. Examples of such an adhesive sheet include a heat-foaming peeling tape (trade name: Revalpha, manufactured by Nitto Denko Corp.), and an ultraviolet curable adhesive sheet (Elep Holder, manufactured by Nitto Denko Corp.).

Figure 12A:
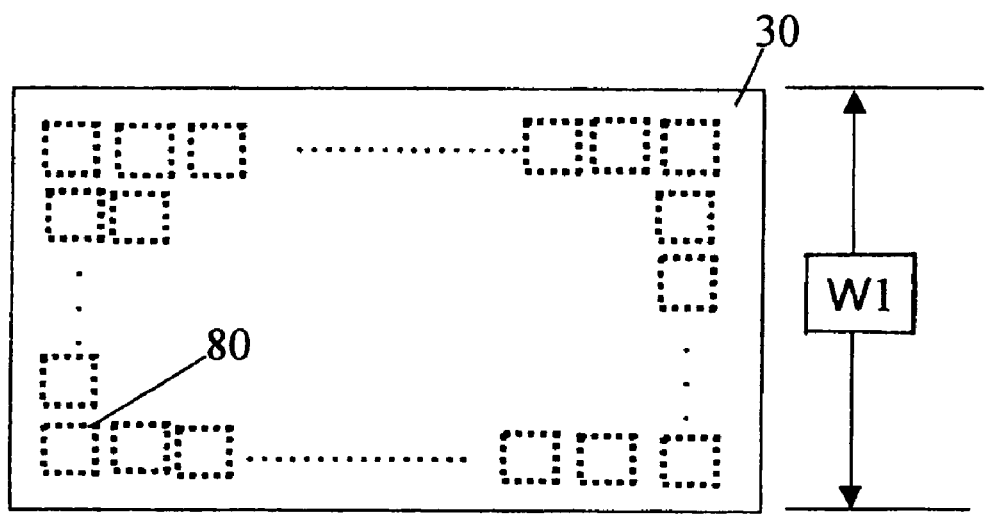
FIGS. 12A and 12B are each a top view of electroconductive portions formed in an adhesive sheet in the step (1) in the semiconductor device production process (III).
Figure 12B:
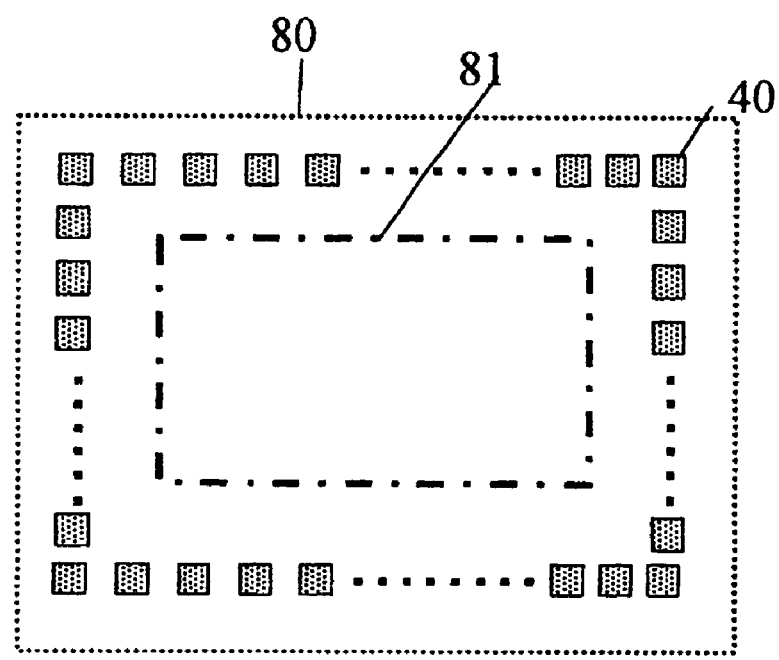

The above-mentioned semiconductor device production process related to the present invention is an example of the case that the single semiconductor element is used. However, according to the semiconductor device production process of the invention, it is practical that plural semiconductor elements are produced. An example thereof is illustrated in FIGS. 12A and 12B. FIG. 12A is a schematic plan view of an adhesive sheet 30. On the upper surface of the adhesive sheet 30, an area where a single semiconductor element is fixed and bonded and electroconductive portions around the area are shown as a single block 80. A plurality of the blocks 80 are formed into cross stripes on a surface of a support. FIG. 12B is an enlarged view of one of the blocks 80. Therein, the electroconductive portions 40, the number of which is a necessary number, are formed around the area 81 where one of the semiconductor elements is fixed and bonded.

In FIG. 12A, the width (W1) of the adhesive sheet is, for example, 500 mm. In this example, the plural blocks 80 that are continuously wound into a roll form are obtained by use of an ordinary photolithographic step and a metal foil etching device. The thus-obtained adhesive sheet 30 of 500 mm width is appropriately cut to give blocks necessary for the next step of fixing and bonding the semiconductor elements (FIG. 12B), the step (3) of wire bonding, and the step (4) of resin-sealing by transfer molding or some other method. In the case that the plural semiconductor elements are sealed with a resin by transfer molding in this way, the product obtained after the resin-molding is cut into a given size. In this way, a semiconductor device is obtained.

EXAMPLES

The present invention will be more specifically described by way of the following working examples. In the following description, the word "part(s)" means "part(s) by weight".

Example 1

The following were mixed: 30 parts of acrylonitrile butadiene rubber (Nipol 1072, manufactured by Nippon Zeon Co., Ltd.), 65 parts of a bisphenol A epoxy type resin (Epikote 828, manufactured by Japan Epoxy Resins Co., Ltd.; epoxy equivalent: 190 g/eq.), and 5 parts of imidazole (C11Z, manufactured by Shikoku Corp.). The mixture was dissolved in a solvent, MEK to set the concentration of the mixture to 35% by weight, so as to prepare an adhesive agent solution. This adhesive agent solution was applied onto a copper foil of 35 µm thickness as a base film, and then dried at 150° C. for 3 minutes, to form an adhesive layer of 10 µm thickness. In this way, an adhesive sheet was yielded.

Example 2

The following were mixed: 24 parts of acrylonitrile butadiene rubber (Nipol 1072, manufactured by Nippon Zeon Co., Ltd.), 65 parts of a bisphenol A type resin (Epikote 1002, manufactured by Japan Epoxy Resins Co., Ltd.; epoxy equivalent: 650 g/eq.), 10 parts of a phenol resin (P-180, manufactured by Arakawa Chemical Industries, ltd.), and 1 part of triphenylphospine (TPP, manufactured by Hokko Chemical Co., Ltd.). The mixture was dissolved in a solvent, MEK to set the concentration of the mixture to 35% by weight, so as to prepare an adhesive agent solution. This adhesive agent solution was applied onto a copper foil of 35 µm thickness as a base film, and then dried at 150° C. for 3 minutes, to form an adhesive layer of 10 µm thickness. In this way, an adhesive sheet was yielded.

Comparative Example 1

The following were mixed: 70 parts of acrylonitrile butadiene rubber (Nipol 1072, manufactured by Nippon Zeon Co., Ltd.), 28 parts of a bisphenol A type resin (Epikote 828, manufactured by Japan Epoxy Resins Co., Ltd.; epoxy equivalent: 190 g/eq.), and 2 parts of imidazole (C11Z, manufactured by Shikoku Kasei K.K.). The mixture was dissolved in a solvent, MEK to set the concentration of the mixture to 35% by weight, so as to prepare an adhesive agent solution. This adhesive agent solution was applied onto a copper foil of 35 µm thickness as a base film, and then dried at 150° C. for 3 minutes, to form an adhesive layer of 10 µm thickness. In this way, an adhesive sheet was yielded.

Comparative Example 2

A silicone based adhesive agent (SD-4587L, manufactured by Toray Industries, Inc. Dow Corning) was applied onto a copper foil of 35 µm thickness as a base film, and then dried at 150° C. for 3 minutes, to form an adhesive layer of 5 µm thickness. In this way, an adhesive sheet was yielded.

About the adhesive sheets of Examples 1 and 2 and Comparative Examples 1 and 2, the tensile storage elastic modulus, the amount of generated siloxane type gases, and paste-remaining property thereof were evaluated by the following methods. The results are shown in Table 1.

[Tensile Storage Elastic Modulus Measuring Method]

An adhesive layer was applied onto a peel liner subjected to releasing treatment so as to have a thickness of 200 µm, thereby yielding only an adhesive layer. The adhesive layer was allowed to stand still at 150° C. in an oven for 1 hour. Thereafter, a viscoelastic spectrum meter (RDS-II) manufactured by Rheometric Scientific, Inc. was used to measure the tensile storage elastic modulus at 200° C. at a frequency of 1 Hz.

[Amount of Generated Siloxane Type Gases]

Each of the adhesive sheets was heated at 200° C. for 30 minutes, and the amount of generated siloxane type gases was quantitatively measured by GC-MS.

[Paste-Remaining Property]

Each of the adhesive sheets was adhered (or laminated) onto the outer pad side of a copper lead frame (Cu-L/F) wherein 4×4 QFNs each having, at each side, 16-pin type terminal portions were arranged under laminating conditions of a temperature of 100° C., a pressure of 0.5 MPa and a laminating speed of 50 mm/min. Next, each of the heat curable adhesive sheets of Examples 1 and 2 was cured at 150° C. for 1 hour. Furthermore, a molding machine (Model-Y-series, manufactured by Towa Co.) was used to mold an epoxy type sealing resin (HC-300, manufactured by Nitto Denko Co., Ltd.) onto the lead frame at 175° C. under the following time conditions: a preheating time of 40 seconds, an injection time of 11.5 seconds, and a curing time of 120 seconds. Thereafter, the adhesive sheet was peeled, and then it was checked whether or not paste remained on the surface of the sealing resin and the surface of the lead frame.

TABLE 1

|  | Example 1 | Example 2 | Comparative Example 1 | Comparative Example 2 |
|---|---|---|---|---|
| Elastic modulus (MPa) at 200° C. | 2.0 | 1.6 | 0.5 | 0.2 |
| Amount (ng/g) of generated siloxane type gases | 7 | 10 | 7 | $1.5 \times 10^4$ |
| Paste-remaining property | Not observed | Not observed | Observed | Not observed |

As is evident from Table 1, in the cases of using Examples 1 and 2 according to the present invention, the releasability from the sealing resin and the lead frame was superior and no paste-remains were observed. Since the non-silicone type material was used, the amount of generated siloxane type gases was extremely small. On the other hand, in the case of using Comparative Example 1, wherein the amount of rubber components was large, which was different from present invention, the elastic modulus after the adhesive sheet was cured was low and the paste-remains were also generated. In the case of using Comparative Example 2, wherein the silicone type adhesive agent was used, the releasability from the sealing resin and the lead frame was superior and no paste-remains were observed, but the amount of generated siloxane type gases was extremely large. Thus, there was a large possibility that metal bonding poorness would be caused at the time of wire bonding or soldering on the basis of the surface polluted with silicone or the transfer of silicone components onto the outer pad side.

The specific embodiments or examples described in the item "DESCRIPTION OF THE EMBODIMENTS" are merely embodiments or examples made the technical contents of the present invention evident. Thus, the present invention should not be limited to such specific examples, and should not be interpreted in a narrow sense. The present invention can be modified into various manners within the scope of the sprit of the present invention and the following claims.

What is claimed is:

1. An adhesive sheet for producing a semiconductor device, which comprises a base layer and an adhesive layer and is used in the process for producing the semiconductor device comprising the step of sealing a semiconductor element connected to an electric conductor with a sealing resin on the adhesive layer,
   wherein the adhesive layer of the adhesive sheet comprises a rubber component and an epoxy resin component and the ratio of the rubber component in organic materials in the adhesive layer is from 5 to 40% by weight, and
   wherein the tensile storage elastic modulus of the adhesive layer is 1 MPa or more at 200° C. after the adhesive layer is cured.

2. The adhesive sheet for producing a semiconductor device according to claim 1, wherein the epoxy resin component has an epoxy equivalent of 1000 g/eq. or less.

3. An adhesive sheet for producing a semiconductor device, comprising:
   a base layer;
   and an adhesive layer formed on the base layer, comprising a rubber component and an epoxy resin component, said rubber component constituting 5–40% by weight of organic materials of the adhesive layer, said adhesive layer having a surface on which a semiconductor element connected to an electric conductor is sealed with a sealing resin.
   wherein the adhesive layer has a tensile storage elastic modulus of 1 MPa or more as measured at 200° C. after the adhesive layer is cured.

4. The adhesive sheet according to claim 3, wherein the epoxy resin component has an epoxy equivalent of 1000 g/eq. or less.

5. The adhesive sheet according to claim 3, wherein the epoxy resin component constitutes 60 95% by weight of the organic materials.

6. The adhesive sheet according to claim 3, wherein the adhesive layer contains no silicon component.

7. The adhesive sheet according to claim 3, wherein the base layer has a thickness of 10–200µm, and the adhesive layer has a thickness of 1–50 µm.

8. A semiconductor device comprising:
   a adhesive sheet comprising a base layer and an adhesive layer formed on the base layer, said adhesive layer comprising a rubber component and an epoxy resin component, said rubber component constituting 5–40% by weight of organic materials of the adhesive layer; and
   a semiconductor element connected to an electric conductor, which is sealed with a sealing resin on the adhesive layer of the adhesive sheets
   wherein the adhesive layer has a tensile storage elastic modulus of 1 MPa or more as measured at 200° C. after the adhesive layer is cured.

9. The semiconductor device according to claim 8, wherein the epoxy resin component has an epoxy equivalent of 1000 g/eq. or less.

10. The semiconductor device according to claim 8, wherein the epoxy resin component constitutes 60–95% by weight of the organic materials.

11. The semiconductor device according to claim 8, wherein the adhesive layer contains no silicon component.

12. An adhesive sheet for producing a semiconductor device, comprising a base layer having a thickness of 10–200µm and an adhesive layer having a thickness of 1–50µm, wherein the adhesive layer comprises a rubber component and an epoxy resin component, and the rubber component constitutes 5–40% by weight of organic materials of the adhesive layer,
    wherein the tensile storage elastic modulus of the adhesive layer is 1 MPa or more at 200° C. after the adhesive layer is cured.

13. The adhesive sheet according to claim 12, wherein the rubber component constitutes 10–30% by weight of the organic materials of the adhesive layer.

14. The adhesive sheet according to claim 12, wherein the rubber component is acrylonitrile butadiene rubber.

15. The adhesive sheet according to claim 12, wherein the epoxy resin component is bisphenol A type epoxy resin.

16. The adhesive sheet according to claim 12, wherein the epoxy resin component has an epoxy equivalent of 1000 g/eq. or less.

17. The adhesive sheet according to claim 16, wherein the epoxy resin component has an epoxy equivalent of 500 g/eq. or less.

18. The adhesive sheet according to claim 12, wherein the epoxy resin component constitutes 60–95% by weight of the organic materials of the adhesive layer.

19. The adhesive sheet according to claim 18, wherein the epoxy resin component constitutes 70–90% by weight of the organic materials of the adhesive layer.

* * * * *

UNITED STATES PATENT AND TRADEMARK OFFICE
CERTIFICATE OF CORRECTION

| | |
|---|---|
| PATENT NO. | : 7,115,989 B2 |
| APPLICATION NO. | : 10/923957 |
| DATED | : October 3, 2006 |
| INVENTOR(S) | : Kazuhito Hosokawa |

It is certified that error appears in the above-identified patent and that said Letters Patent is hereby corrected as shown below:

At Col. 6, Lines 24-31, please delete "The antistatic function makes- - - - - based anionic surfactants." and insert the same after "the base layer 32." on Line 23.

At Col. 13, Line 38, after "peeled" delete "an" and insert --and--, therefor.

At Col. 17, Line 34, in Claim 3, delete "resin." and insert --resin,--, therefor.

At Col. 17, Line 42, in Claim 5, delete "60 95%" and insert --60-95%--, therefor.

At Col. 18, Line 7, in Claim 8, delete "sheets" and insert --sheet,--, therefor.

Signed and Sealed this

Twenty-fifth Day of December, 2007

JON W. DUDAS
*Director of the United States Patent and Trademark Office*